United States Patent
Tanaka et al.

(10) Patent No.: US 11,519,815 B2
(45) Date of Patent: Dec. 6, 2022

(54) METHOD OF MANUFACTURING SEMICONDUCTOR DEVICE AND NON-TRANSITORY COMPUTER-READABLE RECORDING MEDIUM

(71) Applicant: Kokusai Electric Corporation, Tokyo (JP)

(72) Inventors: Akinori Tanaka, Toyama (JP); Shinji Yashima, Toyama (JP); Masahiro Miyake, Toyama (JP)

(73) Assignee: Kokusai Electric Corporation, Tokyo (JP)

( * ) Notice: Subject to any disclaimer, the term of this patent is extended or adjusted under 35 U.S.C. 154(b) by 0 days.

(21) Appl. No.: 17/180,059

(22) Filed: Feb. 19, 2021

(65) Prior Publication Data

US 2021/0172825 A1    Jun. 10, 2021

Related U.S. Application Data

(63) Continuation of application No. PCT/JP2018/035012, filed on Sep. 21, 2018.

(51) Int. Cl.
 *H01L 21/67* (2006.01)
 *G01M 3/32* (2006.01)
 *H01L 21/66* (2006.01)

(52) U.S. Cl.
 CPC ......... *G01M 3/32* (2013.01); *H01L 21/67253* (2013.01); *H01L 22/10* (2013.01)

(58) Field of Classification Search
 CPC .............. H01L 21/67253; H01L 21/67–67796
 See application file for complete search history.

(56) References Cited

U.S. PATENT DOCUMENTS

| 5,365,772 A | 11/1994 | Ueda et al. |
| 2010/0055808 A1 | 3/2010 | Ozaki et al. |

(Continued)

FOREIGN PATENT DOCUMENTS

| JP | 08-045856 A | 2/1996 |
| JP | 2000-195796 A | 7/2000 |
| JP | 2008-021732 A | 1/2008 |

(Continued)

OTHER PUBLICATIONS

Office Action in corresponding Japanese Patent Application No. 2020-547572, dated Aug. 4, 2021, with English translation.

(Continued)

*Primary Examiner* — Jae Lee
(74) *Attorney, Agent, or Firm* — Edell, Shapiro & Finnan, LLC

(57) ABSTRACT

According to one aspect of the technique, there is provided a method of manufacturing a semiconductor device, including checking a leak from a process furnace before a substrate is processed. The checking includes: (a) measuring, by a partial pressure sensor provided at an exhaust pipe, an oxygen partial pressure value of a residual oxygen after the process furnace is vacuum-exhausted; (b) comparing the oxygen partial pressure value measured by the partial pressure sensor with a threshold value; and (c) when the oxygen partial pressure value is higher than the threshold value in (b), performing at least one among: purging the process furnace and evacuating the process furnace.

13 Claims, 8 Drawing Sheets

(56) References Cited

U.S. PATENT DOCUMENTS

2017/0322568 A1* 11/2017 Kumar ............. H01L 21/67017
2020/0022134 A1   1/2020 Ohta et al.

FOREIGN PATENT DOCUMENTS

| JP | 2009-117554 A | 5/2009 | |
|---|---|---|---|
| JP | 2010-74141 A | 4/2010 | |
| JP | 2012-054393 A | 3/2012 | |
| KR | 10-0246115 B1 | 3/2000 | |
| WO | 00/48204 A1 | 8/2000 | |
| WO | WO-2013146118 A1 * | 10/2013 | ............. C23C 16/56 |

OTHER PUBLICATIONS

Korean Office Action in Korean Patent Application No. 10-2021-7002746, dated Jul. 7, 2022, 15 pages, with English Translation.

* cited by examiner

METHOD OF MANUFACTURING SEMICONDUCTOR DEVICE AND NON-TRANSITORY COMPUTER-READABLE RECORDING MEDIUM

CROSS REFERENCE TO RELATED APPLICATIONS

This application is a continuation of International Application No. PCT/JP2018/035012, filed on Sep. 21, 2018, the entire contents of which are hereby incorporated by reference.

TECHNICAL FIELD

The present disclosure relates to a method of manufacturing a semiconductor device and a non-transitory computer-readable recording medium.

BACKGROUND

In a substrate processing apparatus configured to process a wafer (hereinafter, also referred to as a "substrate") under a decompressed environment, a leak check of a furnace of the substrate processing apparatus is performed during a setup operation of the substrate processing apparatus. For example, as the leak check of the furnace, whether or not a gas is leaking from the furnace is checked. For example, according to some related arts, a leak check technique of determining whether to proceed to the next step (film-forming step) according to a severity (leak amount) of a leak check error is described. Further, according to a leak check method (build-up method), an inner pressure of the furnace is decompressed from the atmospheric pressure to a reference pressure, an exhaust valve of the substrate processing apparatus is closed when the reference pressure is reached and maintained, and a pressure increment value of the inner pressure of the furnace is measured after the exhaust valve is closed. According to the leak check method, both of the reference pressure and the pressure increment value are determined by using a total pressure. Therefore, it is difficult to determine a relative amount of oxygen or an oxygen compound contained in an inner atmosphere of the furnace. Further, even when the film-forming step is performed under the same conditions, it is indeterminate whether the resulting product would be acceptable or defective.

As a method of measuring a partial pressure of a residual gas in vacuum, a quadrupole mass spectrometer may be used. When measuring the partial pressure at a pressure of about several Pascal (Pa), a measurement field for the quadrupole mass spectrometer should be maintained in a high vacuum using a differential exhaust system. In order to secure the high vacuum of the measurement field, a pump such as a turbo molecular pump is to be used. Thus, a system including the substrate processing apparatus becomes complicated and expensive, and there are many problems in permanently installing the pump such as the turbo molecular pump in the substrate processing apparatus. For example, a test wafer may be inserted into the furnace in order to check an oxidation degree in the furnace. However, since the test wafer is transferred into the furnace, it may cause a delay in the setup operation of the substrate processing apparatus.

SUMMARY

Described herein is a technique capable of measuring a partial pressure of a gas, which causes a wafer to be oxidized before a film formation, such as a residual gas and a desorbed gas in a process furnace.

According to one aspect of the technique of the present disclosure, there is provided a method of manufacturing a semiconductor device, including: (A) checking a leak from a process furnace before a substrate is processed, wherein (A) includes: (a) measuring, by a partial pressure sensor provided at an exhaust pipe, an oxygen partial pressure value of a residual oxygen after the process furnace is vacuum-exhausted; (b) comparing the oxygen partial pressure value measured by the partial pressure sensor with a threshold value; and (c) when the oxygen partial pressure value is higher than the threshold value in (b), performing at least one among: purging the process furnace and evacuating the process furnace.

DETAILED DESCRIPTION

Embodiments

Figure 1:
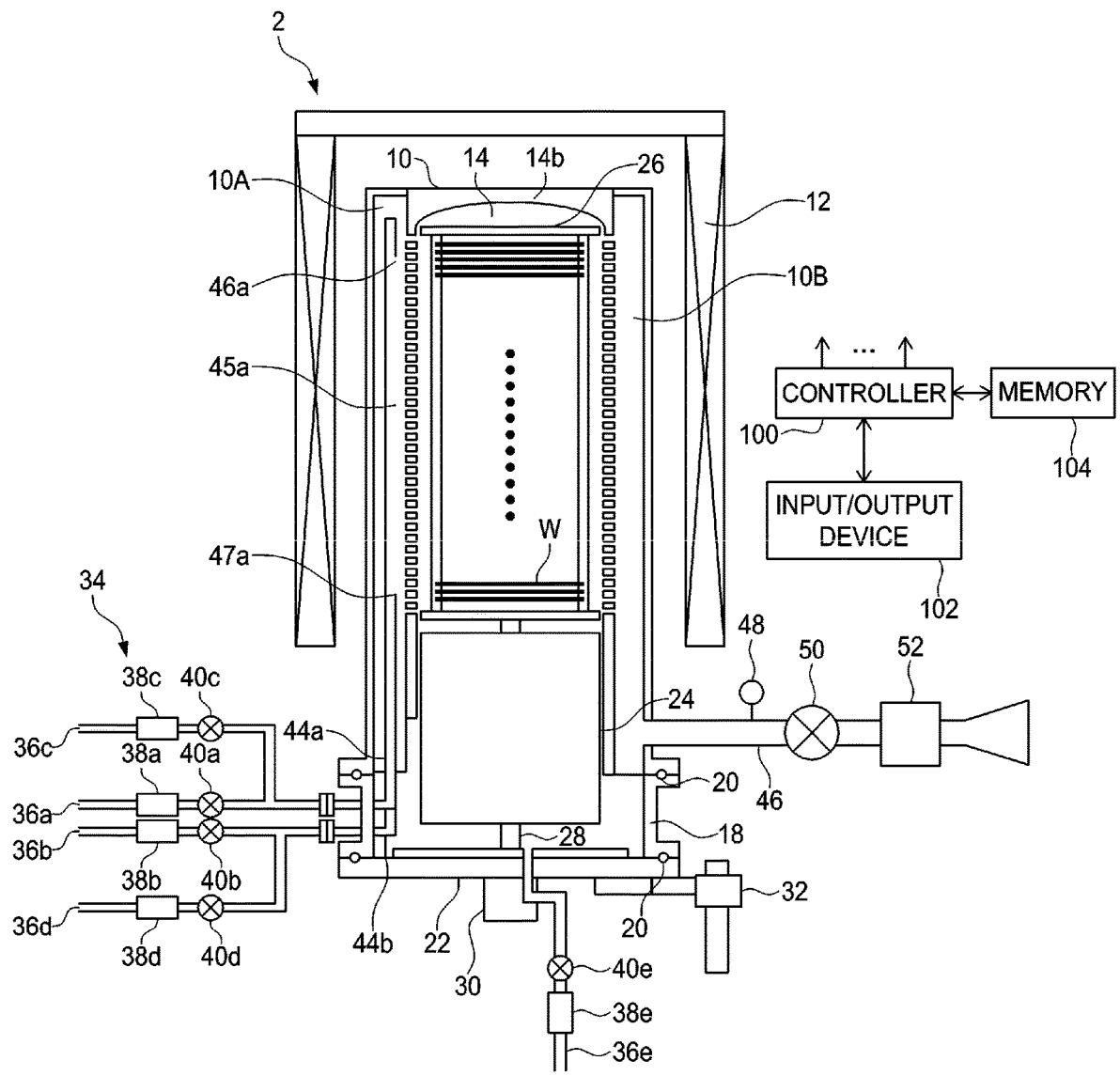
FIG. 1 schematically illustrates a vertical cross-section of a substrate processing apparatus preferably used in one or more embodiments described herein.

Hereinafter, one or more embodiments (also simply referred to as "embodiments") according to the technique of the present disclosure will be described with reference to FIGS. 1 through 8.

(1) Configuration of Substrate Processing Apparatus

Hereinafter, an exemplary configuration of a substrate processing apparatus preferably used in the embodiments will be described with reference to the drawings. Like reference numerals represent like components in the drawings, and redundant descriptions related thereto will be omitted. In the drawings, for the sake of convenience of the descriptions, features such as a width, a thickness and a shape of each component may be schematically illustrated as compared with actual features. However, the drawings are merely examples of the embodiments, and the embodiments according to the technique of the present disclosure are not limited thereto.

Outline of Substrate Processing Apparatus

The substrate processing apparatus described herein as an example is configured to perform a substrate processing such as a film-forming process, which is part of manufacturing processes of a semiconductor device. For example, the substrate processing apparatus is configured as a vertical type substrate processing apparatus (hereinafter, also simply referred to as "processing apparatus") 2 capable of batch-processing a plurality of substrates.

Reaction Tube

As shown in FIG. 1, the processing apparatus 2 includes a reaction tube 10 of a cylinder shape. For example, the reaction tube 10 is made of a heat and corrosion resistant material such as quartz and silicon carbide (SiC).

A process furnace 14 in which a wafer W serving as a substrate is processed is provided in the reaction tube 10. A heater 12 serving as a heating apparatus (heating structure) is installed on an outer periphery of the reaction tube 10. The heater 12 is configured to heat the process furnace 14.

Further, nozzles 44a and 44b described later are installed in the reaction tube 10. A temperature detector (not shown) as a temperature detecting structure is installed vertically along an outer wall of the reaction tube 10.

A manifold 18 of a cylinder shape is connected to a lower end opening of the reaction tube 10 via a seal 20 such as an O-ring. The manifold 18 is configured to support a lower end of the reaction tube 10. For example, the manifold 18 is made of a metal such as stainless steel. A lower end opening of the manifold 18 is opened or closed by a lid 22 of a disk shape. For example, the lid 22 is made of a metal. The seal 20 such as the O-ring is provided on an upper surface of the lid 22 so that an inner atmosphere of the reaction tube 10 is hermetically (airtightly) sealed from an outside atmosphere. A heat insulator 24 is placed on the lid 22. There is provided a hole (not shown) elongated vertically at a center of the heat insulator 24. For example, the heat insulator 24 is made of quartz.

Process Furnace

As described above, the process furnace 14 provided inside the reaction tube 10 is configured to process the wafer W serving as the substrate. Thus, the process furnace 14 is configured such that a boat 26 serving as a substrate retainer is accommodated in the process furnace 14. For example, the process furnace 14 is made of a heat and corrosion resistant material such as quartz and SiC, and is formed as a single body.

Boat

The boat 26 serving as a substrate retainer and accommodated in the process furnace 14 is configured to support a plurality of wafers including the wafer W (for example, 25 to 150 wafers) in the vertical direction in a multistage manner. For example, the boat 26 is made of a material such as quartz or SiC.

The boat 26 is supported above the heat insulator 24 by a rotating shaft 28 passing through the lid 22 and the heat insulator 24. For example, a magnetic fluid seal (not shown) is provided at a portion of the lid 22 where the rotating shaft 28 penetrates the lid 22. The rotating shaft 28 is connected to a rotator 30 installed below the lid 22. Thereby, the boat 26 is rotatably supported by the rotator 30 while maintaining an inner atmosphere of the process furnace 14 to be hermetically sealed.

The lid 22 is moved upward or downward in the vertical direction by a boat elevator 32 serving as an elevator. Thereby, by jointly elevating or lowering the boat 26 and the lid 22 in the vertical direction by the boat elevator 32, the boat 26 is transferred (loaded) into or transferred (unloaded) out of the process furnace 14 provided inside the reaction tube 10.

Gas Supplier

The processing apparatus 2 includes a gas supplier 34 serving as a gas supply system. The gas supplier 34 is configured to supply gases used for the substrate processing to the boat 26 accommodated in the process furnace 14. The gases supplied by the gas supplier 34 may be changed depending on a type of a film to be formed. According to the embodiments, for example, the gas supplier 34 includes a source gas supplier, a reactive gas supplier and an inert gas supplier.

The source gas supplier includes a gas supply pipe 36a connected to a source gas supply source (not shown). A mass flow controller (MFC) 38a serving as a flow rate controller (flow rate controlling structure) and a valve 40a serving as an opening/closing valve are sequentially provided at the gas supply pipe 36a in this order from an upstream side to a downstream side of the gas supply pipe 36a. The gas supply pipe 36a is connected to the nozzle 44a which penetrates a sidewall of the manifold 18. The nozzle 44a is of a tubular shape (pipe-shaped) extending vertically. The nozzle 44a is provided with a vertically elongated slit 45a serving as a gas supply port opening toward the plurality of the wafers including the wafer W supported by the boat 26. A source gas supplied by the source gas supplier described above is diffused through the slit 45a of the nozzle 44a, and then supplied to the plurality of the wafers including the wafer W.

The reactive gas supplier is configured similarly to the source gas supplier. That is, the reactive gas supplier includes a gas supply pipe 36b connected to a reactive gas supply source (not shown), a mass flow controller (MFC) 38b and a valve 40b. The reactive gas supplied by the reactive gas supplier from the reactive gas supply source is supplied to the plurality of the wafers including the wafer W through the nozzle 44b. The nozzle 44b is of a tubular shape (pipe-shaped) extending vertically. The nozzle 44b is provided with a plurality of gas supply holes (not shown) opening toward the plurality of the wafers including the wafer W supported by the boat 26.

The inert gas supplier includes gas supply pipes 36c and 36d connected to the gas supply pipes 36a and 36b, respectively, and mass flow controllers (MFCs) 38c and 38d and valves 40c and 40d provided at the gas supply pipes 36c and 36d, respectively. An inert gas supplied by the inert gas supplier from an inert gas supply source (not shown) is supplied to the plurality of the wafers including the wafer W through the nozzles 44a and 44b. The inert gas serves as a carrier gas or a purge gas.

The inert gas supplier further includes a gas supply pipe 36e penetrating the lid 22 and a mass flow controller (MFC) 38e and a valve 40e provided at the gas supply pipe 36e. The inert gas supplied by the inert gas supplier from the inert gas supply source (not shown) is supplied into the reaction tube 10 in order to prevent the gas such as the source gas and the reactive gas supplied into the process furnace 14 from flowing into the heat insulator 24.

Exhauster

An exhaust pipe 46 is provided at the reaction tube 10. A vacuum pump 52 serving as a vacuum exhaust apparatus is connected to the exhaust pipe 46 through a pressure sensor 48 and an APC (automatic pressure controller) valve 50. The pressure sensor 48 serves as a pressure detector (pressure detecting structure) configured to detect an inner pressure of the process furnace 14, and the APC valve 50 serves as a pressure regulator (pressure adjusting controller). With such a configuration, it is possible to adjust the inner pressure of the process furnace 14 to a process pressure suitable for the substrate processing.

Controller

A controller 100 is electrically connected to and controls the rotator 30, the boat elevator 32, the MFCs 38a through 38e and the valves 40a through 40e of the gas supplier 34 and the APC valve 50. For example, the controller 100 is embodied by a microprocessor (computer) with a CPU (Central Processing Unit), and is configured to control the operations of the processing apparatus 2. An input/output device 102 such as a touch panel is connected to the controller 100.

A memory 104 serving as a recording medium is connected to the controller 100. A control program for controlling the operations of the processing apparatus 2 or a program (also referred to as a "recipe program") for controlling the components of the processing apparatus 2 according to the process conditions to perform a processing is readably stored in the memory 104.

The memory 104 may be embodied by a built-in memory (such as a hard disk and a flash memory) of the controller 100 or a portable external recording apparatus (for example, magnetic tapes, magnetic disks such as a flexible disk and a hard disk, optical disks such as a CD and a DVD, magneto-optical disks such as an MO, and semiconductor memories such as a USB memory and a memory card). The program may be provided to the computer using a communication means such as the Internet and a dedicated line. The program such as the recipe program may be read from the memory 104 by an instruction such as an input from the input/output device 102. The processing apparatus 2 performs a desired processing according to the recipe program under the control of the controller 100 when the controller 100 executes the recipe program.

(2) Substrate Processing

Subsequently, as an example of the substrate processing, a basic sequence of a process (also referred to as the "film-forming process") of forming a film on the wafer W serving as the substrate using the above-described processing apparatus 2 will be described. The film-forming process is part of the manufacturing processes in a method of manufacturing a semiconductor device. Hereinafter, the film-forming process will be described by way of an example wherein a silicon nitride (SiN) film is formed on the wafer W by supplying HCDS ($Si_2Cl_6$: hexachlorodisilane) serving as the source gas and ammonia ($NH_3$) gas serving as the reactive gas to the wafer W. In the following description, the controller 100 controls the operations of components of the processing apparatus 2.

Wafer Charging and Boat Loading Step

When processing the wafer W, firstly, the plurality of the wafers including the wafer W are charged into the boat 26 (wafer charging step).

After the plurality of the wafers including the wafer W are charged into the boat 26 (wafer charging), the boat 26 is loaded into the process furnace 14 by the boat elevator 32 (boat loading step). Then, the lid 22 air-tightly seals the lower end opening of the reaction tube 10.

Pressure and Temperature Adjusting Step

After the wafer charging and boat loading step is completed, in the pressure and temperature adjusting step, the vacuum pump 52 vacuum-exhausts (depressurizes and exhausts) the inner atmosphere of the process furnace 14 until the inner pressure of the process furnace 14 reaches and is maintained at a predetermined pressure (vacuum level) (pressure adjusting step). The inner pressure of the process furnace 14 is measured by the pressure sensor 48, and the APC valve 50 is feedback-controlled based on the measured pressure information. The heater 12 heats the process furnace 14 until the temperature of the wafer W in the process furnace 14 reaches and is maintained at a predetermined temperature. In the pressure and temperature adjusting step, the state of the electric conduction to the heater 12 is feedback-controlled based on the temperature information detected by the temperature detector (not shown) so as to obtain a desired temperature distribution of the inner temperature of the process furnace 14 (temperature adjusting step). The rotator 30 starts to rotate the boat 26 and the plurality of the wafers including the wafer W accommodated in the boat 26.

Film-Forming Process

After the temperature of the process furnace 14 is stabilized at a pre-set process temperature, the film-forming process is performed on the wafer W in the process furnace 14 after a leak check step described in detail later is performed. The film-forming process (also referred to as a "film-forming step") is performed by performing a source gas supply step, a source gas exhaust step, a reactive gas supply step and a reactive gas exhaust step.

Source Gas Supply Step

First, the HCDS gas is supplied to the wafer W in the process furnace 14. A flow rate of the HCDS gas is adjusted to a desired flow rate by the MFC 38a. The HCDS gas whose flow rate is adjusted is supplied into the process furnace 14 via the gas supply pipe 36a and the nozzle 44a.

Source Gas Exhaust Step

Subsequently, the supply of the HCDS gas is stopped, and the vacuum pump 52 vacuum-exhausts the inner atmosphere of the process furnace 14. In the source gas exhaust step, $N_2$ gas serving as the inert gas may be supplied into the process furnace 14 through the inert gas supplier (purge by inert gas).

Reactive Gas Supply Step

Subsequently, the $NH_3$ gas is supplied to the wafer W in the process furnace 14. A flow rate of the $NH_3$ gas is adjusted to a desired flow rate by the MFC 38b. The $NH_3$ gas whose flow rate is adjusted is supplied into the process furnace 14 via the gas supply pipe 36b and the nozzle 44b.

Reactive Gas Exhaust Step

Subsequently, the supply of the $NH_3$ gas is stopped, and the vacuum pump 52 vacuum-exhausts the inner atmosphere of the process furnace 14. In the reactive gas exhaust step, the $N_2$ gas may be supplied into the process furnace 14 through the inert gas supplier (purge by inert gas).

By performing a cycle including the four steps described above a predetermined number of time (one or more times), it is possible to form the SiN film with a predetermined composition and a predetermined thickness on the wafer W.

Boat Unloading and Wafer Discharging Step

After the SiN film with the predetermined composition and the predetermined thickness is formed, the $N_2$ gas is supplied by the inert gas supplier to replace the inner atmosphere of the process furnace 14 with the $N_2$ gas, and the inner pressure of the process furnace 14 is returned to the atmospheric pressure. The lid 22 is then lowered by the boat elevator 32 and the boat 26 is unloaded out of the reaction tube 10 (boat unloading step). Thereafter, the processed wafers including the wafer W are discharged from the boat 26 (wafer discharging step).

For example, the process conditions for forming the SiN film on the wafer W are as follows:

Process temperature (the temperature of the wafer): 300° C. to 700° C.;
Process pressure (the inner pressure of the process furnace): 1 Pa to 4,000 Pa;
Flow rate of the HCDS gas: 100 sccm to 10,000 sccm;
Flow rate of the $NH_3$ gas: 100 sccm to 10,000 sccm; and
Flow rate of the $N_2$ gas: 100 sccm to 10,000 sccm.

By selecting suitable values within the process conditions described above, the film-forming process can be performed properly.

(3) Leak Check Step

Subsequently, the leak check step performed before the film-forming process will be described. In the following description, the controller 100 controls the operations of components of the processing apparatus 2 for performing the leak check step.

The leak check step refers to a step of checking a leak from the process furnace 14 that performs the film-forming step before the process furnace 14 performs the film-forming step which is the substrate processing of processing the wafer W.

Figure 2:
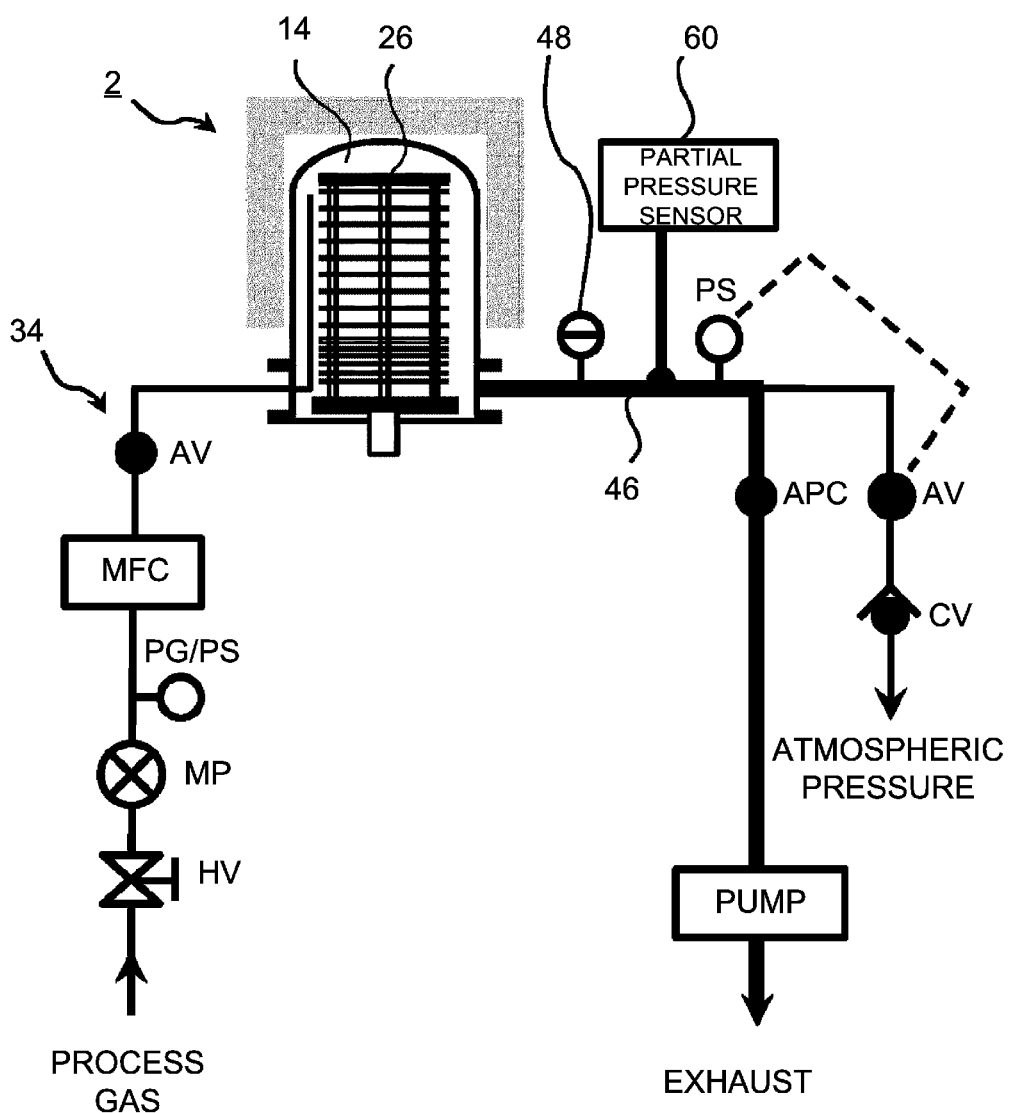
FIG. 2 schematically illustrates an exemplary functional configuration of a leak check of the substrate processing apparatus preferably used in the embodiments described herein.

In order to perform the leak check step, the processing apparatus 2 includes a configuration shown in FIG. 2. That is, for example, the processing apparatus 2 may include: the process furnace 14 capable of forming the film by supplying a process gas (for example, the source gas and the reactive gas) while mounting the wafer W such as a silicon substrate on the boat 26 in a multistage manner and heating the wafer W by the heater 12; the gas supplier 34 configured to supply the process gas to the process furnace 14; the exhaust pipe 46 configured to exhaust the gas such as the process gas after the film-formation process from the process furnace 14. The exhaust pipe 46 is provided with the pressure sensor 48 configured to detect the inner pressure of the process furnace 14, and the pressure sensor 48 continuously detects the inner pressure of the process furnace 14 from the pressure adjusting step (after the boat loading step) until a vacuum level checking step (before the film-forming process) and a pressure control step (during the film-forming process).

Figure 3:
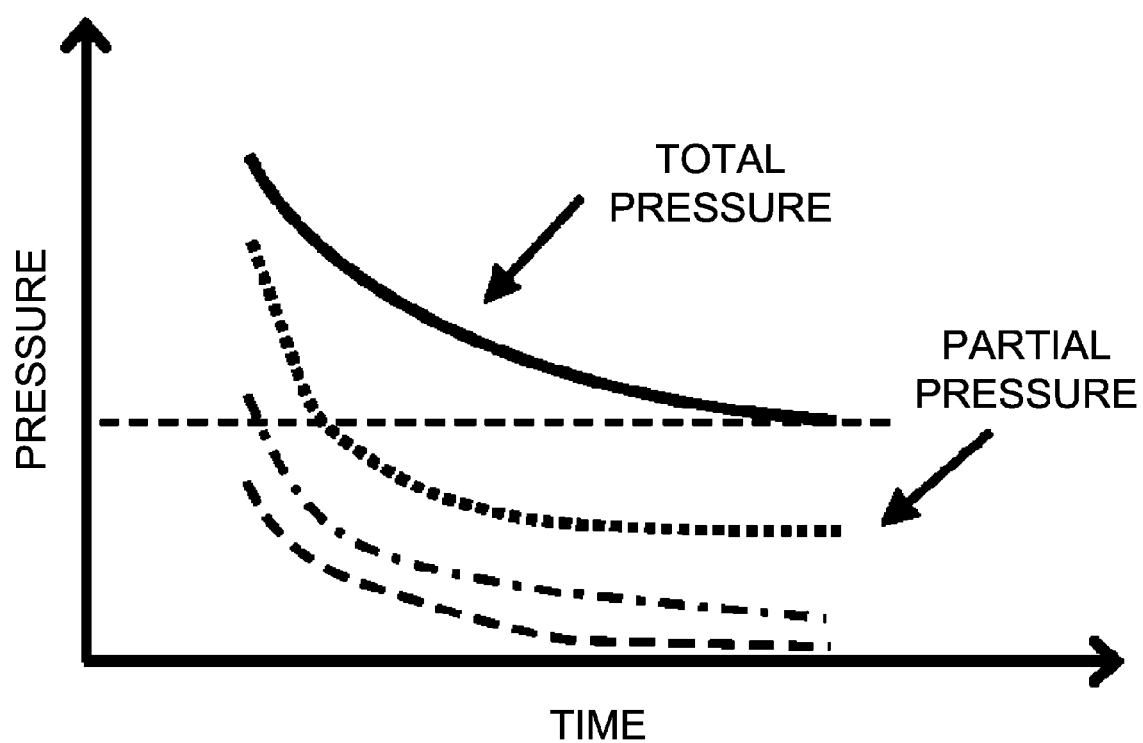
FIG. 3 schematically illustrates a pressure curve when the substrate processing apparatus preferably used in the embodiments described herein is vacuum-exhausted.

The exhaust pipe 46 is provided with a partial pressure sensor 60 capable of measuring a partial pressure of oxygen or a partial pressure of an oxygen compound in the vicinity of the pressure sensor 48. As the partial pressure sensor 60, for example, a zirconia type oxygen concentration meter or a cold cathode gauge capable of measuring a partial pressure of the gas by measuring a discharge emission wavelength may be used. According to the embodiments, for example, a pressure curve when the substrate processing apparatus 2 is vacuum-exhausted as shown in FIG. 3 can be obtained by using the partial pressure sensor 60.

A process flow of the leak check step according to the embodiments will be described with reference to FIGS. 4, 7 and 8. In the process flow shown in FIGS. 4, 7, and 8, the controller 100 controls the operations of the components of the processing apparatus 2.

Figure 4:
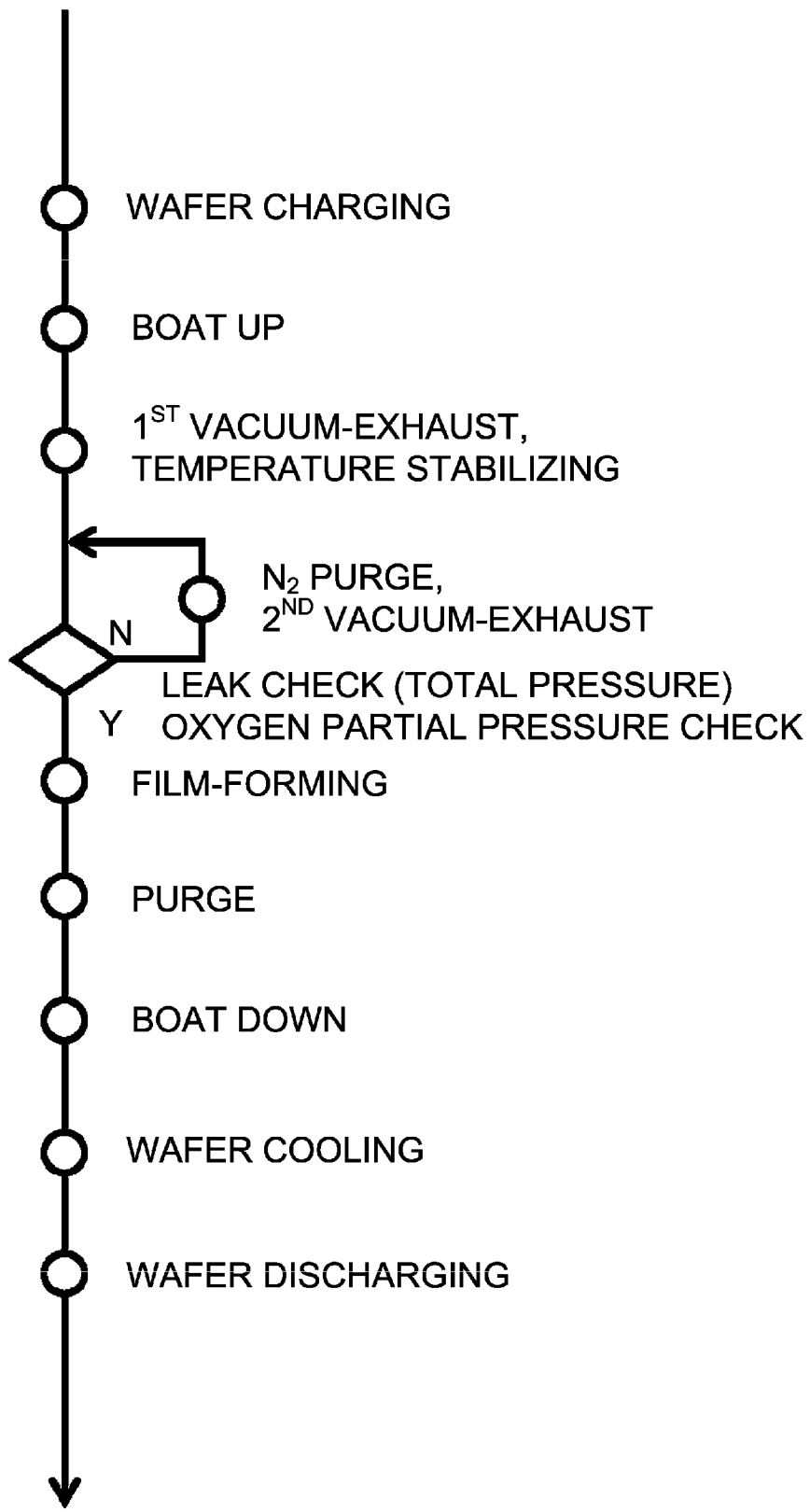
FIG. 4 schematically illustrates a process flow including a leak check step preferably used in the embodiments described herein.

As shown in FIG. 4, the wafer charge step ("WAFER CHARGING" shown in FIG. 4) and the boat loading step ("BOAT UP" shown in FIG. 4) are performed as a step of loading the boat 26 supporting the plurality of the wafers including the wafer W into the process furnace 14. Then, after the wafer charge step and the boat loading step are performed, the vacuum pump 52 vacuum-exhausts the inner atmosphere of the process furnace 14 until the inner pressure of the process furnace 14 reaches and is maintained at a predetermined pressure (vacuum level) ("1ST Vacuum-exhaust" shown in FIG. 4), and the heater 12 heats the process furnace 14 until the temperature of the wafer W in the process furnace 14 reaches and is maintained at a predetermined temperature ("temperature stabilizing" shown in FIG. 4).

Thereafter, when the inner temperature of the process furnace 14 is stabilized, the leak check step is subsequently performed. That is, the leak check step is performed before the film-forming process which is the substrate processing for processing the wafer W. In the leak check step, a step of measuring the residual oxygen after the vacuum-exhaust by the partial pressure sensor 60 provided in the exhaust pipe 46, and a step of comparing the measured partial pressure value of the oxygen (also simply referred to as an "oxygen partial pressure value") with a threshold value are performed. Then, when the oxygen partial pressure value exceeds the threshold value, at least one among an $N_2$ purge ("$N_2$ PURGE" shown in FIG. 4) and an evacuation ("$2^{ND}$ VACUUM-EXHAUST" shown in FIG. 4) is performed. Further, in order to compare the oxygen partial pressure value of the residual oxygen after the vacuum-exhaust with the threshold value, the oxygen partial pressure value and the threshold value are compared at a pressure (for example, a reference vacuum pressure) at which a residual gas is likely to be generated due to the oxidation of the wafer W.

In the leak check step, the partial pressure of the oxygen or the oxygen compound is measured by the partial pressure sensor 60 provided in addition to the pressure sensor 48 ("LEAK CHECK (TOTAL PRESSURE)" shown in FIG. 4), and the measured oxygen partial pressure value is compared with the threshold value ("OXYGEN PARTIAL PRESSURE CHECK" shown in FIG. 4). Thereby, it is determined whether or not the subsequent step (that is, the film-forming step) can be performed. Then, when the measured oxygen partial pressure value does not fall under the pre-set threshold value, the $N_2$ purge by supplying the $N_2$ gas (that is, the inert gas) into the process furnace 14 is performed, or the evacuation, which is vacuum-exhausting (or evacuating) the inner atmosphere of the process furnace 14 through the exhaust pipe 46, is performed, or both of the $N_2$ purge and the evacuation are performed. The leak check step described above is repeatedly performed until the oxygen partial pressure value measured by the partial pressure sensor 60 is equal to or lower than the threshold value.

Subsequently, the $N_2$ purge and the evacuation (also referred to as a "vacuum-exhaust") will be described with reference to FIG. 2. The evacuation refers to exhausting the inner atmosphere of the process furnace 14 until the inner pressure of the process furnace 14 reaches and is maintained at the reference vacuum pressure (also referred to as a "reference pressure"). In the present specification, the reference vacuum pressure refers to a minimum pressure that can be reached when a sucking amount of a vacuum pump such as the vacuum pump 52 becomes zero. In FIG. 2, the vacuum pump ("PUMP" shown in FIG. 2) is operated with a valve ("AV" shown in FIG. 2) closed and the valve ("APC" shown in FIG. 2) open. Further, the $N_2$ purge may be performed by supplying the $N_2$ gas with the valve AV open and exhausting the inner atmosphere of the process furnace 14 by operating the vacuum pump PUMP. The $N_2$ purge may be performed while storing the purge gas (that is, the $N_2$ gas) with the valve AV open and the valve APC closed to elevate the inner pressure of the process furnace 14.

Subsequently, the leak check step will be described in detail with reference to FIG. 7. In the leak check step, first, the inner pressure of the process furnace 14 is detected by the pressure sensor 48 while evacuating (vacuum-exhausting) the inner atmosphere of the process furnace 14. When the inner pressure of the process furnace 14 is equal to or lower than a predetermined pressure, the oxygen partial pressure is detected by the partial pressure sensor 60. The predetermined pressure refers to a pressure determined in advance according to the specifications of the partial pressure sensor 60, and the predetermined pressure according to the present embodiments is about several tens of Pascal (Pa).

When the reference vacuum pressure reached by evacuating the inner atmosphere of the process furnace 14 is higher than the predetermined pressure, the process flow proceeds to a purge step ("PURGE" shown in FIG. 4) without detecting the oxygen partial pressure by the partial pressure sensor 60 and without performing the film-forming step ("FILM-FORMING" shown in FIG. 4). By performing the purge step, the inner atmosphere of the process furnace 14 is replaced with the inert gas such as the $N_2$ gas and the inner pressure of the process furnace 14 is returned to the atmospheric pressure. As described above, when the inner pressure of the process furnace 14 is higher than the predetermined pressure even when the inner pressure of the process furnace 14 is evacuated to reach the reference vacuum pressure, there is a high possibility that the leak has occurred in the process furnace 14.

Further, when the detection of the oxygen partial pressure by the partial pressure sensor 60 is started at the predetermined pressure and the inner pressure of the process furnace 14 reaches the pressure at which the residual gas is likely to be generated due to the oxidation of the wafer W, it is determined whether or not the oxygen partial pressure value measured by the partial pressure sensor 60 is less than the threshold value. When the oxygen partial pressure value measured by the partial pressure sensor 60 is less than the threshold value, it is determined that the subsequent step can be performed, and the film-forming step of processing the wafer W is performed.

Further, when the oxygen partial pressure value measured by the partial pressure sensor 60 is equal to or higher than the threshold value, the measurement of the oxygen partial pressure value by the partial pressure sensor 60 is interrupted, and the inner atmosphere of the process furnace 14 is purged ($N_2$ purged) until a target pressure (for example, an arbitrary pressure equal to or higher than the predetermined pressure) is reached. The target pressure may be set as desired, and may be a pressure smaller than the predetermined pressure. Then, the evacuation of the inner atmosphere of the process furnace 14 is restarted from the target pressure and then the predetermined pressure is reached, the measurement of the oxygen partial pressure value by the partial pressure sensor 60 is restarted. Then, when the reference vacuum pressure is reached, the oxygen partial pressure value measured by the partial pressure sensor 60 and the threshold value are re-compared.

As a result of the comparison, when the oxygen partial pressure value measured by the partial pressure sensor 60 is less than the threshold value, it is determined that the subsequent step can be performed, and the film-forming step of processing the wafer W is performed. As a result of the comparison, when the oxygen partial pressure value is higher than the threshold value, the measurement of the oxygen partial pressure value by the partial pressure sensor 60 is interrupted, and it is determined that the number of times of comparing the oxygen partial pressure value with the threshold value has reached a predetermined number of times. When it is determined that the number of times of comparing the oxygen partial pressure value with the threshold value has not reached the predetermined number of times, the inner atmosphere of the process furnace 14 is purged again until the target pressure is reached. As described above, even when the oxygen partial pressure value is equal to or higher than the threshold value, the inner atmosphere of the process furnace 14 may be repeatedly purged and evacuated up to the predetermined number of times. When the oxygen partial pressure value is less than the threshold value even after comparing the oxygen partial pressure value with the threshold value the predetermined number of times, the process flow proceeds to the purge step ("PURGE" shown in FIG. 4), and the leak check step is forcibly terminated.

Figure 7:
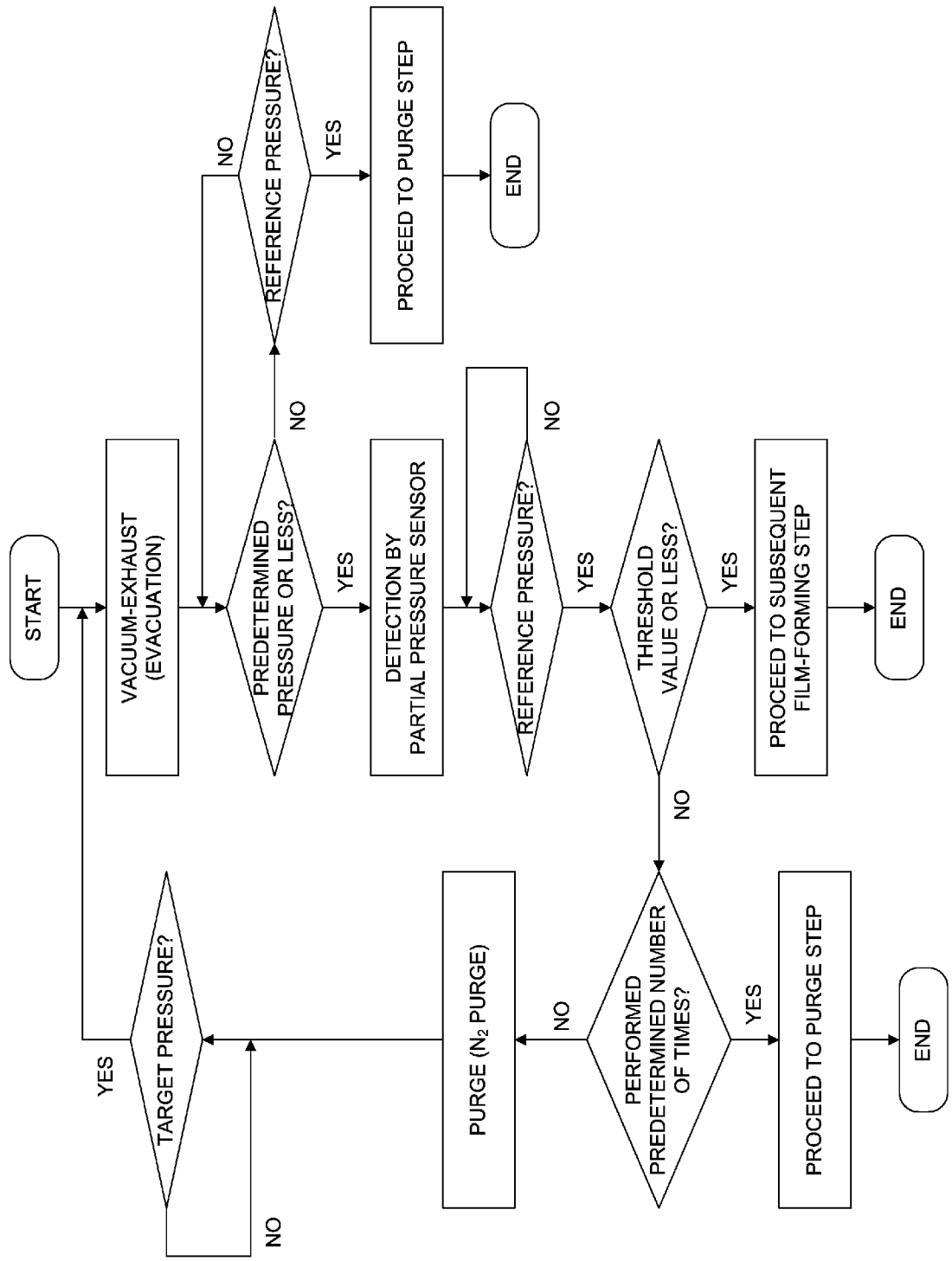
FIG. 7 is a flowchart schematically illustrating the leak check step preferably used in the embodiments described herein.
Figure 8:
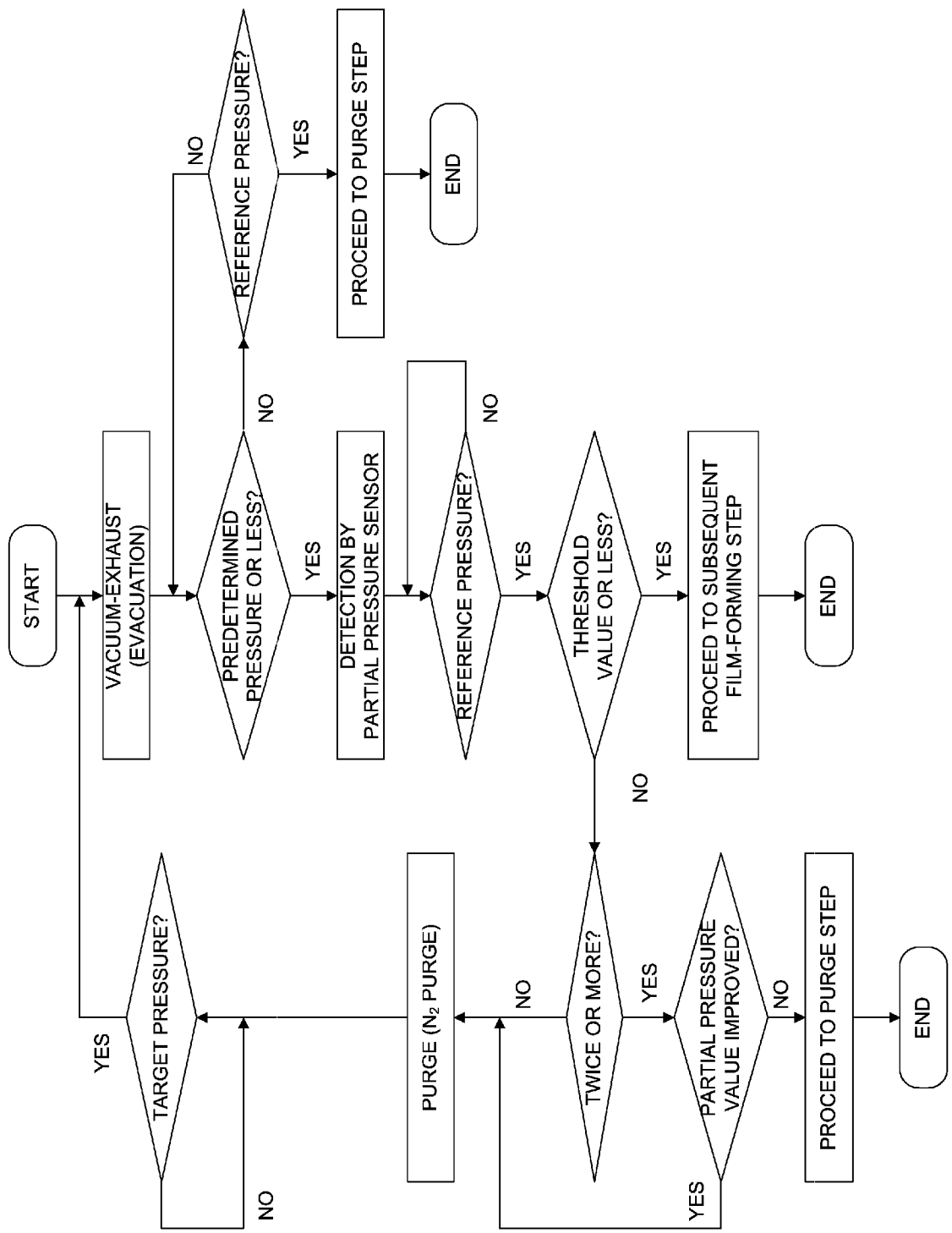
FIG. 8 is a flowchart schematically illustrating a leak check step preferably used in a modified example of the embodiments described herein.

FIG. 8 schematically illustrates a modified example of the leak check step shown in FIG. 7. In the following description, features of the modified example different from those of the leak check step shown in FIG. 7 will be described in detail below, and the description of features of the modified example the same as those of the leak check step shown in FIG. 7 will be omitted or simplified.

First, the detection of the oxygen partial pressure by the partial pressure sensor 60 is started at the predetermined pressure while evacuating (vacuum-exhausting) the inner atmosphere of the process furnace 14. Then, the residual oxygen when the reference vacuum pressure is reached is measured by the partial pressure sensor 60, and the measured oxygen partial pressure value is compared with the threshold value. When the oxygen partial pressure value measured by the partial pressure sensor 60 is less than the threshold value, the process flow proceeds to the film-forming step. On the other hand, when the oxygen partial pressure value measured by the partial pressure sensor 60 is higher than the threshold value, the measurement of the oxygen partial pressure value by the partial pressure sensor 60 is interrupted. Then, it is determined whether or not the number of times of comparing the oxygen partial pressure value with the threshold value is twice or more. Since t number of times of comparing the oxygen partial pressure value with the threshold value is once, the inner atmosphere of the process furnace 14 is purged ($N_2$ purged) until the inner pressure of the process furnace 14 reaches the target pressure. When the inner pressure of the process furnace 14 reaches the target pressure again, the oxygen partial pressure value is measured by the partial pressure sensor 60, and the oxygen partial pressure value measured by the partial pressure sensor 60 at the reference vacuum pressure and the threshold value are re-compared while evacuating (vacuum-exhausting) the inner atmosphere of the process furnace 14. When the oxygen partial pressure value is less than the threshold value, the process flow proceeds to the film-forming step, and the leak check step is terminated.

As a result of the re-comparison, when the oxygen partial pressure value is equal to or higher than the threshold value, it is determined whether or not the number of times of comparing the oxygen partial pressure value with the threshold value is twice or more. When the number of times of comparing the oxygen partial pressure value with the threshold value is twice or more, it is determined whether or not the oxygen partial pressure value measured by the partial pressure sensor 60 is beneficially reduced. For example, when the oxygen partial pressure value is higher than the threshold value but less than the oxygen partial pressure value in the previous comparison, the controller 100 determines that the oxygen partial pressure value is beneficially reduced.

Specifically, as a result of the re-comparison, when the oxygen partial pressure value is equal to or higher than the threshold value and the oxygen partial pressure value remains unchanged from or becomes higher than the oxygen partial pressure value in the previous comparison, the measurement of the oxygen partial pressure value by the partial pressure sensor 60 is stopped, the process flow proceeds to the purge step, and leak check step is terminated. Then, the purge step ("PURGE" shown in FIG. 4) is performed such that the inner atmosphere of the process furnace 14 is replaced with the inert gas and the inner pressure of the process furnace 14 is returned to the atmospheric pressure. On the other hand, when the oxygen partial pressure value is equal to or higher than the threshold value and the oxygen partial pressure value is beneficially reduced to be smaller than the oxygen partial pressure value in the previous comparison, the measurement of the oxygen partial pressure value by the partial pressure sensor 60 is interrupted, and the inner atmosphere of the process furnace 14 is purged ($N_2$ purged) until the target pressure is reached while detecting the inner pressure of the process furnace 14 by the pressure sensor 48. Then, the evacuation of the inner atmosphere of the process furnace 14 is performed again. When the reference vacuum pressure is reached, the oxygen partial pressure value measured by the partial pressure sensor 60 and the threshold value are compared. As described above, in the process flow shown in FIG. 8, while it is determined whether or not the oxygen partial pressure value is beneficially reduced, the purge to the target pressure and the evacuation from the target pressure to the reference vacuum pressure are repeatedly performed until the oxygen partial pressure value reaches the threshold value.

In the substrate processing, as described above, the wafer W in the process furnace 14 is processed by performing the film-forming process (that is, the source gas supply step, the source gas exhaust step, the reactive gas supply step and the reactive gas exhaust step). Then, when the film-forming process is completed, the inner atmosphere of the process furnace 14 is replaced with the $N_2$ gas and purged ("PURGE" shown in FIG. 4), and then the boat unloading step ("BOAT DOWN" shown in FIG. 4), a wafer cooling step ("WAFER COOLING" shown in FIG. 4) and the wafer discharging step ("WAFER DISCHARGING" shown in FIG. 4) are performed as a step of unloading the processed wafers including the wafer W out of the process furnace 14.

Subsequently, the threshold value used in the leak check step will be described.

Figure 5:
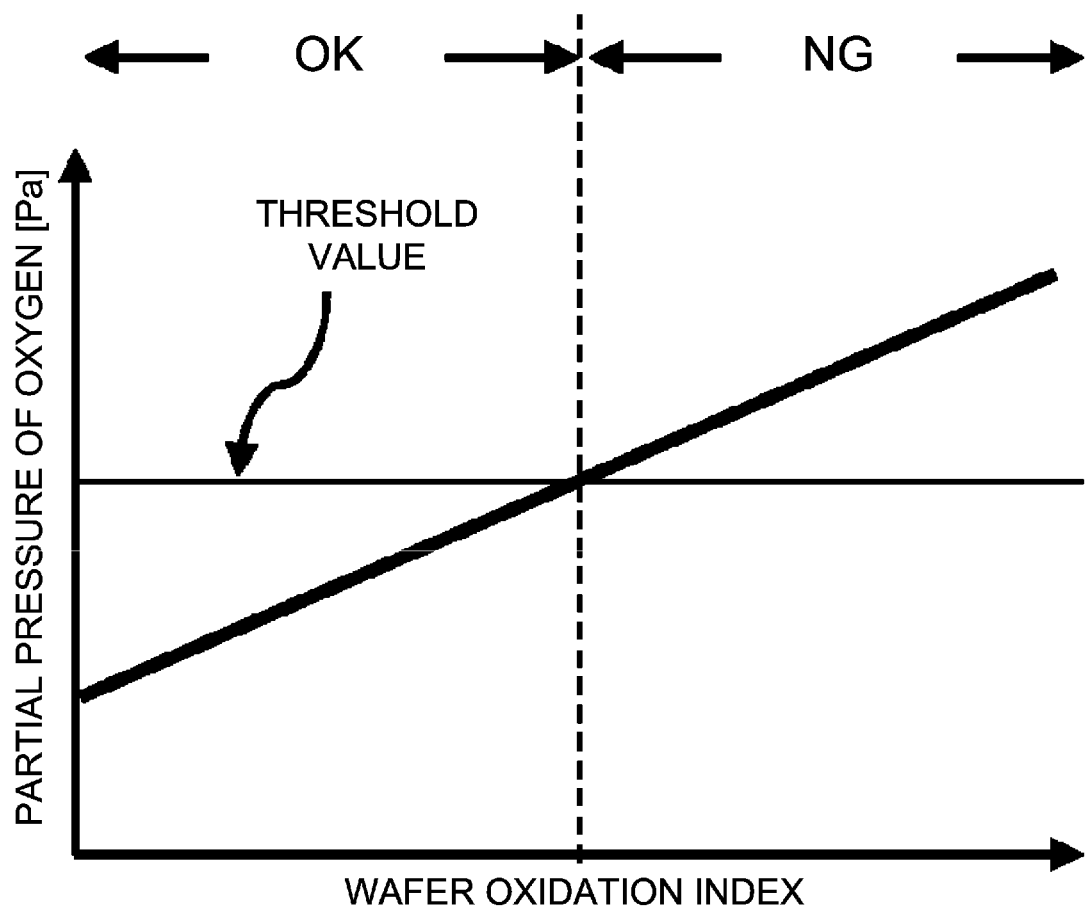
FIG. 5 schematically illustrates a relationship between a wafer oxidation index and a partial pressure of oxygen preferably used in the embodiments described herein.

As shown in FIG. 5, the threshold value used in the leak check step is set based on an oxidation degree of a wafer under the film-forming conditions acquired in advance. For example, it is possible to determine the oxidation degree of the wafer by obtaining a sheet resistance value of the wafer after processing the wafer on which a titanium nitride (TiN) film is formed. That is, the threshold value refers to a value determined in advance by a relationship between the oxygen partial pressure value acquired in advance and the sheet resistance value of the wafer on which the TiN film is formed. The relationship between the oxygen partial pressure value and the sheet resistance value can be determined by preparing a test wafer including the wafer on which the TiN film is formed and obtaining the sheet resistance value when the test wafer is loaded into the process furnace 14.

Figure 6:
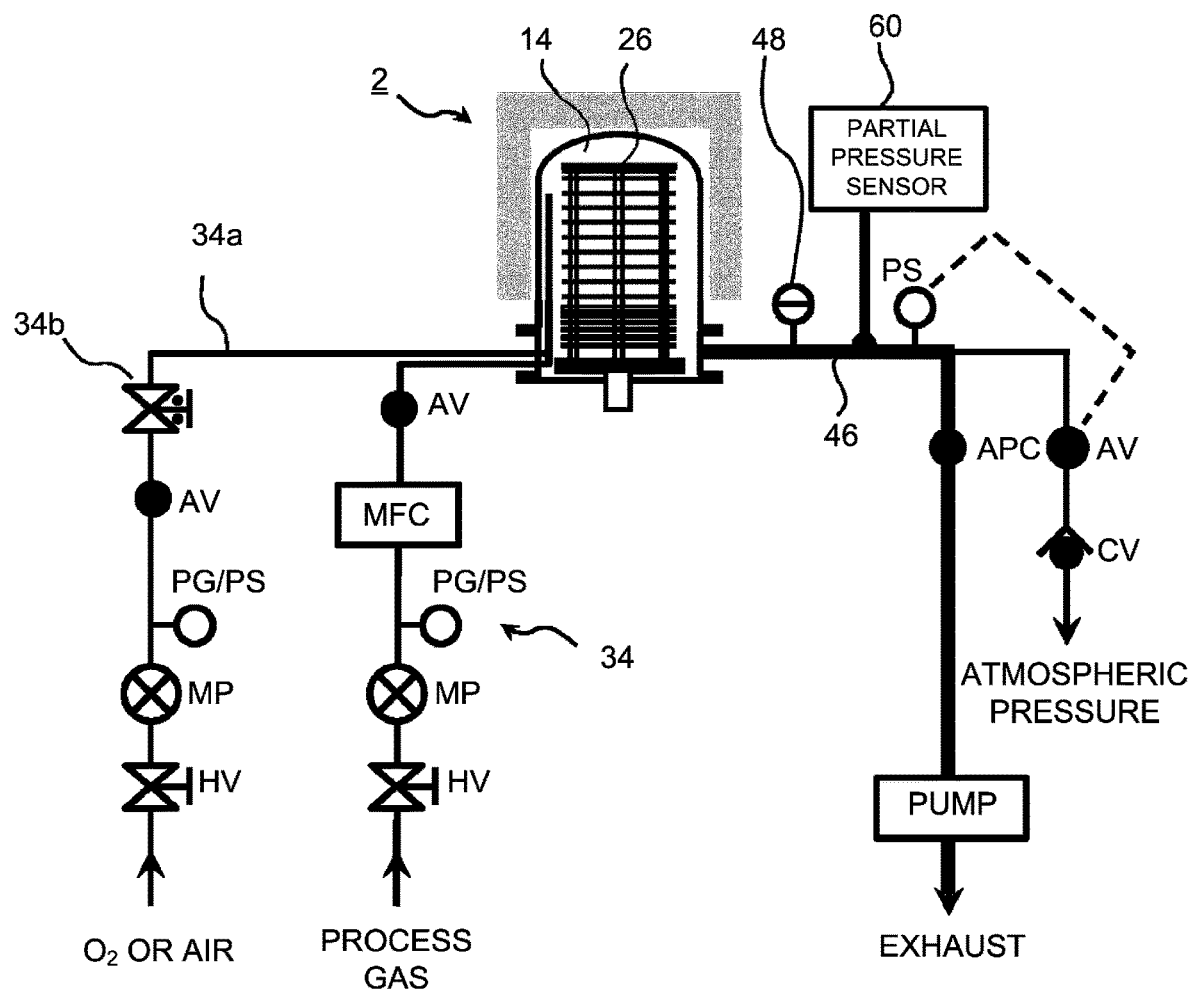
FIG. 6 schematically illustrates an exemplary evaluation configuration of acquiring a correlation between a minute leak and a wafer oxidation preferably used in the embodiments described herein.

Specifically, it is possible to derive a correlation between an amount of a minute leak (that is, an amount of the partial pressure of the residual oxygen or the oxygen compound) and the oxidation degree of the wafer by conducting experiments with a configuration shown in FIG. 6. According to the configuration shown in FIG. 6, a line 34a of introducing the oxygen or the air is provided on a gas supply side of the substrate processing apparatus 2, and a needle valve 34b capable of controlling a minute flow rate is provided on the line 34a at a location immediately before where the gas is introduced into the process furnace 14. By adjusting an opening degree of the needle valve 34b, it is possible to change the partial pressure of the residual oxygen or the oxygen compound to generate a minute leak state. Then, by changing the partial pressure of the residual oxygen or the oxygen compound, the TiN test wafer is heat-treated for monitoring the oxidation degree of the wafer under each condition. Then, the correlation between the partial pressure of the residual oxygen (or the oxygen compound) and the oxidation degree of the wafer is obtained from the resulting sheet resistance value. As described above, the threshold value of the partial pressure of the residual oxygen or the oxygen compound can be determined by the specified sheet resistance value of the TiN test wafer.

(4) Effects According to Present Embodiments

According to the present embodiments, it is possible to provide at least one or more of the following effects.

(a) According to the present embodiments, the partial pressure of the gas such as the residual gas and a desorbed gas in the process furnace 14, which causes the wafer W to be oxidized before the film-forming step is performed, can be measured. Therefore, it is possible to more reliably check the conditions of the process furnace 14 before the film-forming step is performed. As a result, it is possible to suppress the oxidation of the wafer W during the film-forming step, and it is also possible to consistently maintain the quality of the substrate processing.

(b) According to the present embodiments, an absolute amount (that is, the partial pressure) of the residual gas or the desorbed gas in the process furnace 14 related to the oxidation of the wafer can be adjusted for each batch. As a result, it is possible to measure the partial pressure of the desorbed gas in the process furnace 14 before the film-forming step, which cannot be measured by the conventional leak check based on measuring the leak amount. Therefore, it is possible to suppress the oxidation of the wafer W during the film-forming step, and it is also possible to consistently maintain the quality of the substrate processing.

(c) According to the present embodiments, by comparing the threshold value and the partial pressure of the residual gas (that is, the oxygen partial pressure value) under a decompressed environment (for example, under the reference vacuum pressure) at which the residual gas is likely to be generated due to the oxidation of the wafer, it is possible to more accurately grasp the conditions of the process furnace 14 before the film-forming step is performed. As a result, it is possible to suppress the oxidation of the wafer W during the film-forming step, and it is also possible to consistently maintain the quality of the substrate processing.

(d) According to the present embodiments, the threshold value is determined by the measured value when the TiN test wafer used to check the conditions after the maintenance of the process furnace 14 is transferred into the process furnace 14. Therefore, it is possible to more accurately grasp the conditions of the process furnace 14 before the film-forming step is performed. As a result, it is possible to suppress the oxidation of the wafer during the film-forming step, and it is also possible to consistently maintain the quality of the substrate processing.

(e) According to the present embodiments, by repeatedly performing the purge ($N_2$ purge) and/or the evacuation (vacuum-exhaust) while measuring the partial pressure of the residual gas (that is, the oxygen partial pressure value) under the decompressed environment (for example, under the reference vacuum pressure) at which the residual gas is likely to be generated due to the oxidation of the wafer, it is possible to maintain the process furnace 14 in a clean condition. As a result, it is possible to suppress the oxidation of the wafer W during the film-forming step, and it is also possible to consistently maintain the quality of the substrate processing.

(f) According to the present embodiments, by repeatedly performing the purge ($N_2$ purge) and/or the evacuation (vacuum-exhaust), it is possible to perform the substrate processing after the process furnace 14 is brought into a clean condition. As a result, it is possible to reduce the lot rejection (lot-out) due to the stoppage of the processing.

(g) According to the present embodiments, a setup operation of the substrate processing apparatus can be performed without using the TiN test wafer to check the conditions of the process furnace 14 after the maintenance and without using the TiN test wafer checking batch. Therefore, it is possible to improve the efficiency of the setup operation, and it is also possible to increase a utilization rate of the substrate processing apparatus. Further, an external leak can be easily checked without using a He leak detector after the maintenance of the process furnace 14. Therefore, it is possible to improve the efficiency of the setup operation, and it is also possible to increase the utilization rate of the substrate processing apparatus.

Other Embodiments

While the technique is described in detail by way of the embodiments, the above-described technique is not limited thereto. The above-described technique may be modified in various ways without departing from the gist thereof.

For example, the above-described embodiments are described based on the substrate processing apparatus used in the manufacturing processes of the semiconductor device and the method of manufacturing the semiconductor device. However, the above-described technique is not limited thereto. For example, the above-described technique may also be applied to a substrate processing apparatus such as an LCD (Liquid Crystal Display) manufacturing apparatus configured to process a glass substrate and a method of manufacturing the LCD.

Further, as for the film-forming process, the above-described technique may also be applied to any process other than the film-forming process described above as long as the inner pressure of the furnace is decompressed to process the substrate. The above-described technique may also be applied to process a film other than the oxide film.

Further, the film-forming process described above may include a process such as a CVD (chemical vapor deposition) process, a PVD (Physical Vapor Deposition) process, a process of forming a nitride film and a process of forming a film containing a metal.

For example, the above-described embodiment and the modified example described based on the substrate processing apparatus configured to perform the film-forming process and the method of manufacturing the semiconductor device. However, the above-described technique is not limited thereto. For example, the above-described technique may also be applied to other substrate processing apparatuses such as an exposure apparatus, a lithography apparatus, a coating apparatus and a CVD apparatus using plasma.

According to some embodiments in the present disclosure, it is possible to measure the partial pressure of the gas, which causes the wafer to be oxidized before the film-forming step is performed, such as the residual gas and the desorbed gas in the process furnace.

What is claimed is:

1. A method of manufacturing a semiconductor device, comprising:
    (A) checking a leak from a process furnace before a substrate is processed, wherein (A) comprises:
        (a) measuring, by a partial pressure sensor provided at an exhaust pipe, an oxygen partial pressure value of a residual oxygen after the process furnace is vacuum-exhausted;
        (b) comparing the oxygen partial pressure value measured by the partial pressure sensor with a threshold value; and
        (c) when the oxygen partial pressure value is equal to or higher than the threshold value in (b), performing at least one among: purging the process furnace and evacuating the process furnace;
        (d) detecting an inner pressure of the process furnace by a pressure sensor while evacuating the process furnace; and
        (e) measuring the oxygen partial pressure by the partial pressure sensor when the inner pressure of the process furnace detected in (d) is equal to or lower than a predetermined pressure.

2. The method of claim 1, wherein the pressure sensor is provided at the exhaust pipe, and the partial pressure sensor is arranged in vicinity of the pressure sensor.

3. The method of claim 1, wherein the partial pressure sensor starts measuring the oxygen partial pressure value when the process furnace is evacuated to the predetermined pressure, and the oxygen partial pressure value when the process furnace is evacuated to a reference vacuum pressure is compared with the threshold value in (c).

4. The method of claim 3, wherein (A) further comprises:
    (f) when the oxygen partial pressure value is equal to or higher than the threshold value in (b), performing:
        (f-1) interrupting measuring the oxygen partial pressure value by the partial pressure sensor, and purging the process furnace until a target pressure is reached;
        (f-2) restarting evacuating the process furnace and restarting measuring the oxygen partial pressure value by the partial pressure sensor when the target pressure is reached; and
        (f-3) comparing the oxygen partial pressure value measured at the reference vacuum pressure with the threshold value, and
    wherein (f) is performed a predetermined number of times.

5. The method of claim 3, wherein (A) further comprises:
    (g) counting the number of times of comparing the oxygen partial pressure value with the threshold value; and
    (h) when the oxygen partial pressure value is equal to or higher than the threshold value and the number of times counted in (g) is once, performing:
        (h-1) interrupting measuring the oxygen partial pressure value by the partial pressure sensor, and purging the process furnace until a target pressure is reached;

(h-2) restarting evacuating the process furnace from the target pressure and restarting measuring the oxygen partial pressure value by the partial pressure sensor; and (h-3) comparing the oxygen partial pressure value measured at the reference vacuum pressure with the threshold value.

6. The method of claim 5, further comprising:

(B) purging the process furnace such that an inner atmosphere of the process furnace is replaced with an inert gas and the inner pressure of the process furnace is returned to an atmospheric pressure when the oxygen partial pressure value is equal to or higher than the threshold value, the number of times counted in (g) is twice or more and the oxygen partial pressure value remains unchanged from or becomes higher than a previous value of oxygen partial pressure, wherein ((B) is performed after stopping measuring the oxygen partial pressure value by the partial pressure sensor.

7. The method of claim 5, wherein (A) further comprises:

(i) when the oxygen partial pressure value is equal to or higher than the threshold value, the number of times counted in (g) is twice or more and the oxygen partial pressure value is lower than a previous value of oxygen partial pressure, performing:

(i-1) interrupting measuring the oxygen partial pressure value by the partial pressure sensor, and purging the process furnace until a target pressure is reached;

(i-2) restarting evacuating the process furnace from the target pressure and restarting measuring the oxygen partial pressure value by the partial pressure sensor; and (i-3) comparing the oxygen partial pressure value measured at the reference vacuum pressure with the threshold value.

8. The method of claim 7, wherein (A) further comprises:

(j) when the oxygen partial pressure value is equal to or higher than the threshold value, the number of times counted in (g) is twice or more and the oxygen partial pressure value is equal to or lower than the previous value of oxygen partial pressure, performing:

(j-1) purging the process furnace until the target pressure is reached;

(j-2) restarting evacuating the process furnace when the target pressure is reached; and (j-3) comparing the oxygen partial pressure value measured at the reference vacuum pressure with the threshold value, wherein (j-1), (j-2) and (j-3) are performed until the oxygen partial pressure value becomes lower than the threshold value by the oxygen partial pressure value being reduced.

9. The method of claim 1, further comprising:

(C) purging the process furnace such that an inner atmosphere of the process furnace is replaced with an inert gas and the inner pressure of the process furnace is returned to an atmospheric pressure without measuring the oxygen partial pressure by the partial pressure sensor when the inner pressure of the process furnace detected in (d) is higher than the predetermined pressure after the process furnace is evacuated to a reference vacuum pressure.

10. The method of claim 1, further comprising:

(D) processing the substrate, wherein (D) is performed when the oxygen partial pressure value is lower than the threshold value in (b).

11. A method of manufacturing a semiconductor device, comprising:

(A) checking a leak from a process furnace before a substrate is processed, wherein (A) comprises:

(a) measuring, by a partial pressure sensor provided at an exhaust pipe, an oxygen partial pressure value of a residual oxygen after the process furnace is vacuum-exhausted;

(b) comparing the oxygen partial pressure value measured by the partial pressure sensor with a threshold value; and (c) when the oxygen partial pressure value is equal to or higher than the threshold value in (b), performing at least one among: purging the process furnace and evacuating the process furnace, and wherein the threshold value is determined in advance by a relationship between the oxygen partial pressure value acquired in advance and a sheet resistance value of the substrate on which a titanium nitride film is formed.

12. The method of claim 11, wherein the relationship between the oxygen partial pressure value and the sheet resistance value is determined by a sheet resistance value when a test substrate comprising the substrate on which the titanium nitride film is formed is transferred into the process furnace.

13. A non-transitory computer-readable recording medium storing a program that causes, by a computer, a substrate processing apparatus to perform:

(A) checking a leak from a process furnace before a substrate is processed, wherein (A) comprises:

(a) measuring, by a partial pressure sensor provided at an exhaust pipe, an oxygen partial pressure value of a residual oxygen after the process furnace is vacuum-exhausted;

(b) comparing the oxygen partial pressure value measured by the partial pressure sensor with a threshold value; and (c) when the oxygen partial pressure value is equal to or higher than the threshold value in (b), performing at least one among: purging the process furnace and evacuating the process furnace;

(d) detecting an inner pressure of the process furnace by a pressure sensor while evacuating the process furnace; and (e) measuring the oxygen partial pressure by the partial pressure sensor when the inner pressure of the process furnace detected in (d) is equal to or lower than a predetermined pressure.

* * * * *